United States Patent
Bronn et al.

(10) Patent No.: US 11,005,574 B2
(45) Date of Patent: May 11, 2021

(54) SUPERCONDUCTING INTERPOSER FOR OPTICAL TRANSDUCTION OF QUANTUM INFORMATION

(71) Applicant: INTERNATIONAL BUSINESS MACHINES CORPORATION, Armonk, NY (US)

(72) Inventors: Nicholas T. Bronn, Long Island City, NY (US); Daniela F. Bogorin, Syracuse, NY (US); Patryk Gumann, Tarrytown, NY (US); Sean Hart, Tarrytown, NY (US); Salvatore B. Olivadese, Stamford, CT (US); Jason S. Orcutt, Katonah, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 7 days.

(21) Appl. No.: 16/455,043

(22) Filed: Jun. 27, 2019

(65) Prior Publication Data

US 2020/0412457 A1    Dec. 31, 2020

(51) Int. Cl.
*H04B 10/04* (2006.01)
*H04B 10/70* (2013.01)
*G06N 10/00* (2019.01)

(52) U.S. Cl.
CPC ............. *H04B 10/70* (2013.01); *G06N 10/00* (2019.01)

(58) Field of Classification Search
CPC ........ H04B 10/70; H04B 10/50; H04B 10/40; H04B 10/548; G06N 10/00; B82Y 20/00;
(Continued)

(56) References Cited

U.S. PATENT DOCUMENTS 8,817,254 B2    8/2014  Santori et al.
9,260,289 B2    2/2016  Park
(Continued)

OTHER PUBLICATIONS

"The Superconductive Circuit Board," Omni Circuit Boards, retrieved from https://www.omnicircuitboards.com/blog/topic/aluminum-trace-pcb-superconductive-pcb.
(Continued)

*Primary Examiner* — Hibret A Woldekidan
(74) *Attorney, Agent, or Firm* — Henry J. Daley; Venable LLP (57) ABSTRACT

A system for optical transduction of quantum information includes a qubit chip including a plurality of data qubits configured to operate at microwave frequencies, and a transduction chip spaced apart from the qubit chip, the transduction chip including a microwave-to-optical frequency transducer. The system includes an interposer coupled to the qubit chip and the transduction chip, the interposer including a dielectric material including a plurality of superconducting microwave waveguides formed therein. The plurality of superconducting microwave waveguides is configured to transmit quantum information from the plurality of data qubits to the microwave-to-optical frequency transducer on the transduction chip, and the microwave-to-optical frequency transducer is configured to transduce the quantum information from the microwave frequencies to optical frequencies.

25 Claims, 7 Drawing Sheets

(58) Field of Classification Search
CPC .... H04L 9/0852; Y10S 977/933; G02F 1/332; G02F 1/353; G02F 2/02; H01S 3/0085; H01S 3/005; H01S 5/0092; G02B 2006/12121; G02B 6/12; G02B 6/12004
USPC ....... 398/135, 138, 139, 182, 183, 185, 200, 398/136
See application file for complete search history.

(56) References Cited

U.S. PATENT DOCUMENTS

| | | | |
|---|---|---|---|
| 9,296,609 | B2 | 3/2016 | Park |
| 9,454,061 | B1* | 9/2016 | Abdo ............... G02F 1/353 |
| 2004/0183453 | A1* | 9/2004 | Suzuki ............ H01J 37/32192 315/111.71 |
| 2006/0086101 | A1* | 4/2006 | Miki ..................... F17C 1/00 62/48.2 |
| 2016/0133819 | A1* | 5/2016 | Greer ............... H01L 21/76801 257/31 |
| 2017/0248832 | A1 | 8/2017 | Kippenberg et al. |
| 2017/0261770 | A1* | 9/2017 | Bishop ................ H01P 7/086 |
| 2018/0003753 | A1* | 1/2018 | Bishop ................ G06N 10/00 |
| 2018/0113373 | A1* | 4/2018 | Witmer .................. G02F 1/39 |
| 2018/0262276 | A1* | 9/2018 | Bishop ................ H04B 10/70 |
| 2019/0044668 | A1* | 2/2019 | Elsherbini ............ H04L 5/0001 |
| 2019/0049495 | A1* | 2/2019 | Ofek ..................... G06F 17/14 |
| 2020/0234171 | A1* | 7/2020 | Chu ................. H01L 29/66977 |
| 2020/0242500 | A1* | 7/2020 | Girvin .................. G06F 11/322 |

OTHER PUBLICATIONS

"Cryogenic Cables, 2018 Edition" retrieved from http://www.coax.co.jp/en/wcaxp/wp-content/themes/coax/pdf/cryogenic_cable_catalogue.pdf.

Abdo et al. "Josephson amplifier for qubit readout," arXiv:1103.1405v2 [cond-mat.supr-con] Oct. 25, 2011.

Giles. "We'd have more quantum computers if it weren't so hard to find the damn cables," MIT Technology Review (Jan. 19, 2019) retrieved from https://www.technologyreview.com/s/612760/quantum-computers-component-shortage.

Fowler et al. "Surface codes: Towards practical large-scale quantum computation," Physical Review A 86, (2012), 332324-1-032324-48.

Foxen et al. "High speed flux sampling for tunable superconducting qubits with an embedded cryogenic transducer," Supercond. Sci. Technol. 32 (2019) 015012 (11 pp).

Pappas et al. "Enhanced superconducting transition temperature in electroplated rhenium." Appl. Phys. Lett. 112, 182601 (2018), pp. 182601-1-182601-5.

Abdo et al. "Josephson Directional Amplifier for Quantum Measurement of Superconducting Circuits." Phys. Rev. Lett. 112, 167701 (2014), pp. 167701-1-167701-5.

Maccabe et al. "Phononic bandgap nano-acoustic cavity with ultralong phonon lifetime." arXiv:1901.04129v1 [quant-ph] Jan. 14, 2019.

Andrews et al. "Bidirectional and efficient conversion between microwave and optical light." Nature Physics, vol. 10, Apr. 2014, pp. 321-326.

Keller et al. "Superconducting qubits on silicon substrates for quantum device integration." arXiv:1703.10195v2 [quant-ph] Apr. 3, 2017.

Soltani et al. "Efficient quantum microwave-to-optical conversion using electro-optic nanophotonic coupled-resonators." arXiv:1711.00346v1 [quant-ph] Nov. 1, 2017.

Zhang et al. "Monolithic Ultrahigh-Q Lithium Niobate Microring Resonator." arXiv:1712.04479v1 [physics.optics] Dec. 12, 2017.

Rosenberg et al. "3D integrated superconducting qubits." Nature Partner Journals Quantum Information (2017) 42.

* cited by examiner

SUPERCONDUCTING INTERPOSER FOR OPTICAL TRANSDUCTION OF QUANTUM INFORMATION

BACKGROUND

The currently claimed embodiments of the present invention relate to systems and methods for optical transduction of quantum information, and more specifically, to a superconducting interposer for the optical transduction of quantum information.

Superconducting qubits operate in the microwave regime of the electromagnetic spectrum. At microwave frequencies, microwave transmission lines (i.e., coaxial cable, striplines in printed circuit boards) are very lossy (~1 dB/foot attenuation). These losses prevent quantum information from being transported far. For example, the losses preclude quantum information from being transported outside of the dilution refrigerator environment using microwave transmission lines. Optical transduction converts a microwave photon to optical frequency (i.e., telecommunication range ~1550 nm). In this regime of the electromagnetic spectrum, photons may propagate virtually lossless (~0.2 dB/km) through an optical fiber or free space. However, the materials and operation for qubits and optical transducers are often incompatible.

SUMMARY

According to an embodiment of the present invention, a system for optical transduction of quantum information includes a qubit chip including a plurality of data qubits configured to operate at microwave frequencies, and a transduction chip spaced apart from the qubit chip, the transduction chip including a microwave-to-optical frequency transducer. The system includes an interposer coupled to the qubit chip and the transduction chip, the interposer including a dielectric material including a plurality of superconducting microwave waveguides formed therein. The plurality of superconducting microwave waveguides is configured to transmit quantum information from the plurality of data qubits to the microwave-to-optical frequency transducer on the transduction chip, and the microwave-to-optical frequency transducer is configured to transduce the quantum information from the microwave frequencies to optical frequencies.

According to an embodiment of the present invention, a method for performing optical transduction of quantum information includes providing a qubit chip including a plurality of data qubits configured to operate at microwave frequencies, and transferring quantum information from the plurality of data qubits to a transduction chip spaced apart from the qubit chip, the transduction chip including a microwave-to-optical frequency transducer. The method includes performing microwave-to-optical frequency transduction of the quantum information while shielding the plurality of data qubits from stray light fields using a dielectric interposer disposed between the qubit chip and the transduction chip, and outputting the quantum information as an optical-frequency signal.

According to an embodiment of the present invention, a quantum computer includes a refrigeration system under vacuum including a containment vessel, and a qubit chip contained within a refrigerated vacuum environment defined by the containment vessel, wherein the qubit chip includes a plurality of data qubits configured to operate at microwave frequencies. The system further includes a transduction chip contained within the refrigerated vacuum environment defined by the containment vessel, the transduction chip being spaced apart from the qubit chip and including a microwave-to-optical frequency transducer. The system includes an interposer contained within the refrigerated vacuum environment defined by the containment vessel, the interposer being coupled to the qubit chip and the transduction chip, the interposer including a dielectric material including a plurality of superconducting microwave waveguides formed therein. The plurality of superconducting microwave waveguides is configured to transmit quantum information from the plurality of data qubits to the microwave-to-optical frequency transducer on the transduction chip, and the microwave-to-optical frequency transducer is configured to transduce the quantum information from the microwave frequencies to optical frequencies.

DETAILED DESCRIPTION

Figure 1:
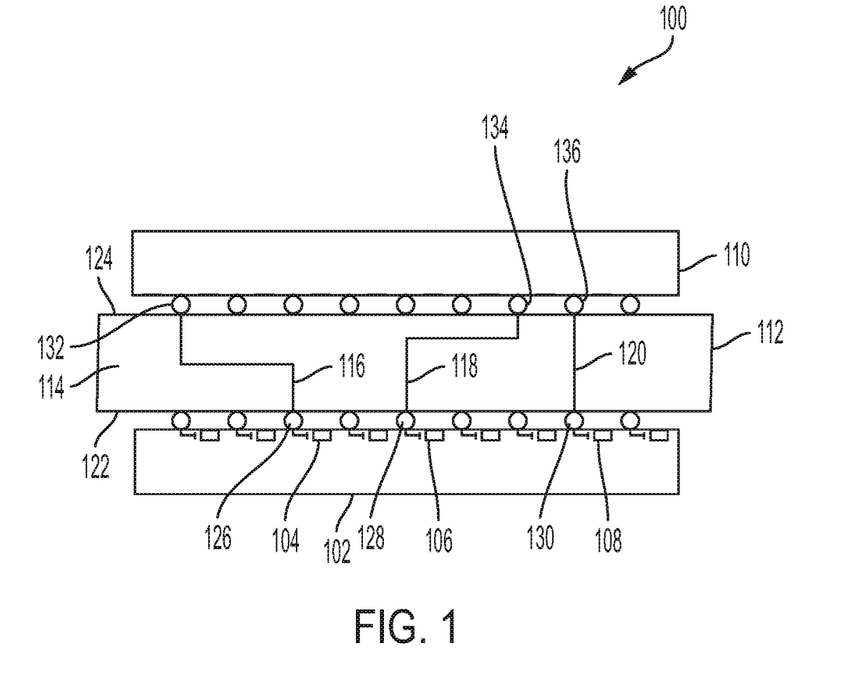
FIG. 1 is a schematic illustration of a system for optical transduction of quantum information according to an embodiment of the invention.

FIG. 1 is a schematic illustration of a system 100 for optical transduction of quantum information according to an embodiment of the current invention. The system 100 includes a qubit chip 102 comprising a plurality of data qubits 104, 106, 108 configured to operate at microwave frequencies. The system 100 includes a transduction chip 110 spaced apart from the qubit chip 102. The transduction chip 110 includes a microwave-to-optical frequency transducer (not shown in FIG. 1; see FIG. 2A). The system 100 includes an interposer 112 coupled to the qubit chip 102 and the transduction chip 110. The interposer 112 includes a dielectric material 114 comprising a plurality of superconducting microwave waveguides 116, 118, 120 formed therein. The plurality of superconducting microwave waveguides 116, 118, 120 is configured to transmit quantum information from the plurality of data qubits 104, 106, 108 to the microwave-to-optical frequency transducer on the transduction chip 110. The microwave-to-optical frequency transducer is configured to transduce the quantum information from the microwave frequencies to optical frequencies. Although the embodiment of FIG. 1 shows an example having a particular number of data qubits, microwave-to-optical frequency transducers, and superconducting microwave waveguides, the embodiments of the invention are not limited to these particular numbers. Embodiments of the invention could include more or fewer data qubits, microwave-to-optical frequency transducers, and superconducting microwave waveguides.

According to an embodiment of the current invention, the microwave-to-optical frequency transducer is further configured to transduce quantum information from optical frequencies to microwave frequencies, and the plurality of superconducting microwave waveguides 116, 118, 120 is configured to transmit the quantum information from the microwave-to-optical frequency transducer on the transduction chip to the plurality of data qubits 104, 106, 108.

As shown in FIG. 1, the interposer 112 according to an embodiment of the invention includes a first surface 122 and a second surface 124 opposite the first surface 122. The qubit chip 102 is coupled to the first surface 122 of the interposer 112, and the transduction chip 110 is coupled to the second surface 124 of the interposer 112.

According to an embodiment of the invention, the qubit chip is bonded to the interposer. In FIG. 1, the qubit chip 102 is bonded to the interposer 112 using a plurality of solder bumps 126, 128, 130. The solder bumps 126, 128, 130 may be directly coupled to the superconducting microwave waveguides 116, 118, 120, and capacitively coupled to the data qubits 104, 106, 108. The solder bumps may be formed from a superconducting material, although the embodiments of the invention are not limited to solder bumps formed from superconducting materials. One example material for the solder bumps is indium. Embodiments of the current invention are not limited to the number of solder bumps shown in the example illustrated in FIG. 1.

According to an embodiment of the invention, the transduction chip is bonded to the interposer. In FIG. 1, the transduction chip 110 is bonded to the interposer 112 using a plurality of solder bumps 132, 134, 136. The solder bumps 132, 134, 136 couple the microwave-to-optical frequency transducer to the superconducting microwave waveguides 116, 118, 120. The system 100 according to an embodiment of the present invention may include multiple qubit chips and transduction chips. The qubit chips and transduction chips may be bonded to a single interposer, or to multiple interposers.

The system according to an embodiment of the current invention enables the transfer of quantum information from a superconducting qubit chip through superconducting waveguides embedded in a dielectric interposer to a chip that performs optical transduction. The system separates stray light fields generated by microwave-to-optical transducers disposed on the transduction chip from the data qubits on the superconducting qubit chip through a packaging solution. Namely, data qubits may be formed on one chip, while a microwave-to-optical transducer may be formed on another chip. Thus, materials processing steps are separated between the qubit chip and the optical transduction chip. The data qubits on the qubit chip may be fabricated using materials and processes that optimize qubit coherence. Meanwhile, the transduction chip may be fabricated using materials and processes that facilitate microwave-to-optical transduction, without impacting the quality of the data qubits.

The system may also include qubits on the transduction chip. In this case, the qubit chip may possess qubits of high quality, while qubits on the transduction chip need only have lifetimes greater than transduction time, which ranges from 10 ns to 1 µs. Further, substrates such as electro-optic or piezoelectric materials that may be useful for forming a transduction chip are often not compatible with high qubit lifetimes. It is also difficult to fabricate long-lived qubits on silicon on insulator (SOI), which is often used as a transduction substrate. Qubits formed on SOI often have T1 and T2 times on the order of 3 µs. Processing techniques that are useful for forming microwave-to-optical transducers, such as multiple lithographic steps, may degrade qubit lifetime due to junction annealing and/or introduction of two-level systems (i.e., dielectric loss). By separating data qubits and microwave-to-optical transducers on different chips, optimal processing techniques can be used to form each chip and the structures included thereon.

Figure 2A:
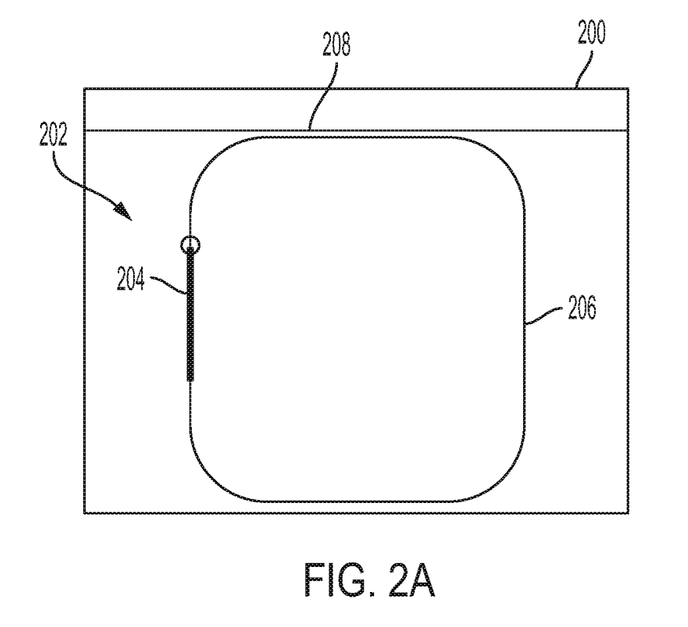
FIG. 2A is a schematic illustration of a transduction chip according to an embodiment of the invention.

According to an embodiment of the current invention, the microwave-to-optical frequency transducer comprises a microwave waveguide coupled to a device configured to operate in an optical frequency domain. FIG. 2A is a schematic illustration of a transduction chip 200. The transduction chip 200 includes a microwave-to-optical frequency transducer 202 that includes a microwave waveguide 204 coupled to a device 206 configured to operate in an optical frequency domain. The device 206 may be, for example, an optical resonator in the shape of a ring, an oval, a race track, or a double FIG. 8. The device 206 may be, for example, a bulk acoustic wave resonator, a mechanical coupler, or a membrane. The transduction chip 200 may also include an optical pump line 208 coupled to the device 206. The optical pump line 208 is configured to transmit quantum information as an optical-frequency signal.

Figure 2B:
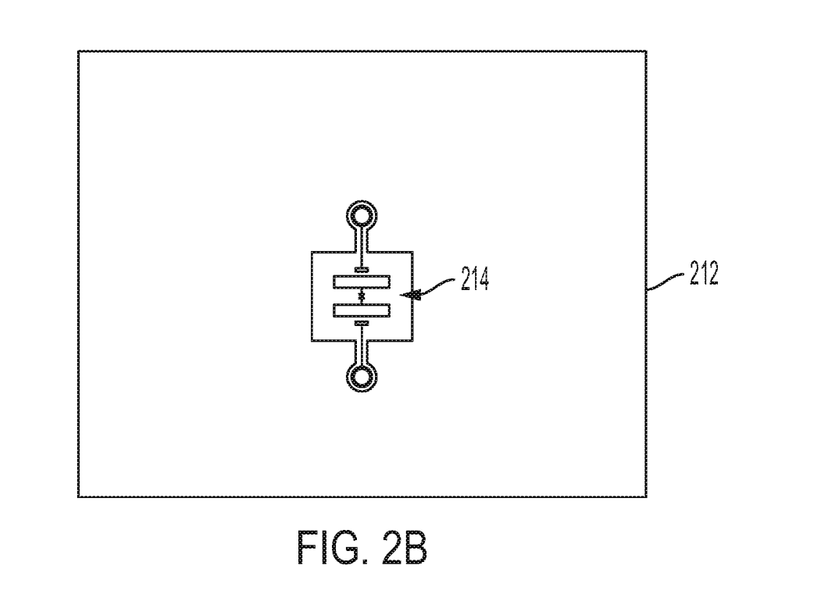
FIG. 2B is a schematic illustration of a qubit chip according to an embodiment of the current invention.

FIG. 2B is a schematic illustration of a qubit chip 212 according to an embodiment of the current invention. The qubit chip 212 includes a data qubit 214 configured to operate at microwave frequencies.

Figure 2C:
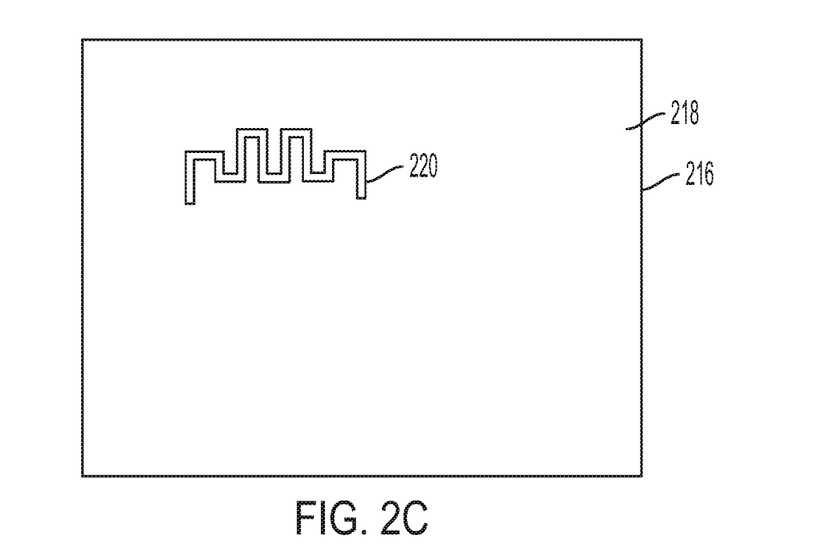
FIG. 2C is a schematic illustration of an interposer according to an embodiment of the current invention.

FIG. 2C is a schematic illustration of an interposer 216 according to an embodiment of the current invention. The interposer 216 includes a dielectric material 218 including a superconducting microwave waveguide 220 formed therein. According to an embodiment of the present invention, the dielectric material 218 includes one or more of a printed circuit board, an organic laminate, a silicon chip, a ceramic, a glass-reinforced epoxy laminate material such as FR-4, duroid, or polyether ether ketone (PEEK), for example. According to an embodiment of the present invention, the superconducting microwave waveguide 220 may be formed from one or more of niobium, aluminum, tin, electroplated rhenium, or indium, for example.

Figure 2D:
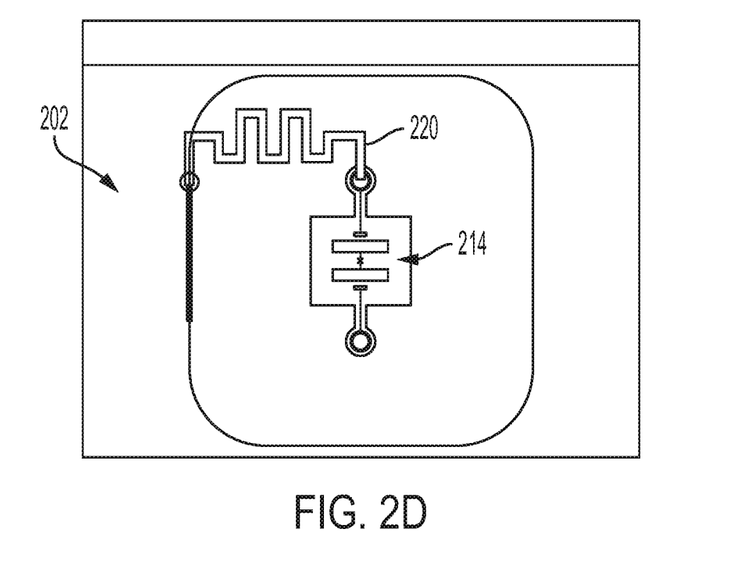
FIG. 2D is a schematic illustration of the interposer of FIG. 2C coupled to the transduction chip of FIG. 2A and the qubit chip of FIG. 2B according to an embodiment of the current invention.

FIG. 2D is a schematic illustration of the interposer coupled to the transduction chip and the qubit chip according to an embodiment of the current invention. The superconducting microwave waveguide 220 is configured to transmit quantum information from the data qubit 214 to the microwave-to-optical frequency transducer 202 on the transduction chip. Although FIGS. 2B and 2D show a qubit chip that has a single data qubit 214, the qubit chip according to an embodiment of the present invention may include a plurality of data qubits. Although FIGS. 2C and 2D show an interposer that has a single superconducting microwave waveguide 220, the interposer according to an embodiment of the present invention may include a plurality of superconducting microwave waveguide.

According to an embodiment of the present invention, the transduction chip includes a plurality of transduction qubits.

Figure 3A:
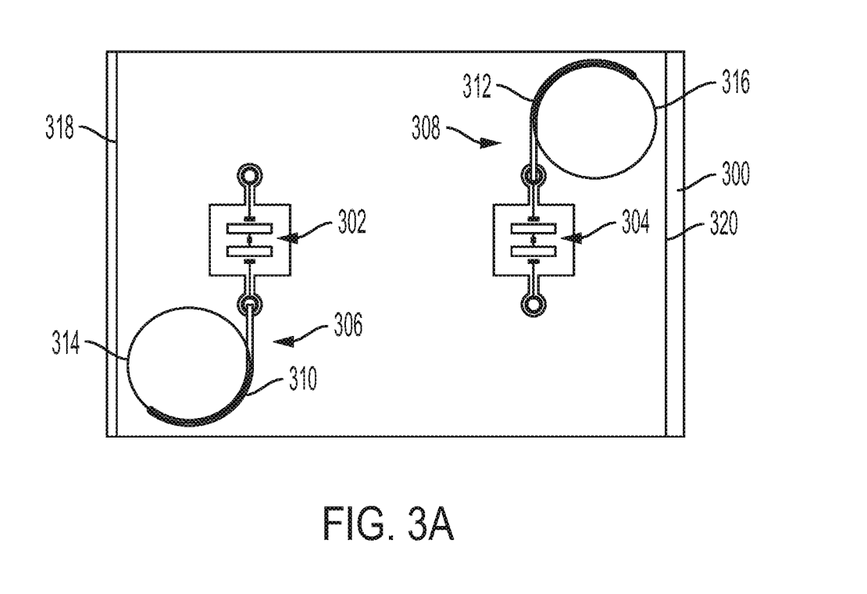
FIG. 3A is a schematic illustration of a transduction chip that includes two transduction qubits.

FIG. 3A is a schematic illustration of a transduction chip 300 that includes two transduction qubits 302, 304. Each of the transduction qubits 302, 304 is coupled to a microwave-to-optical frequency transducer 306, 308. The microwave-to-optical frequency transducers 306, 308 according to an embodiment of the invention each include a microwave waveguide 310, 312 coupled to a resonator 314, 316 configured to operate in an optical domain. The resonators 314, 316 may have a variety of shapes, for example, a ring, a race track, or a FIG. 8. The resonators 314, 316 may each be coupled to an optical pump line 318, 320.

Figure 3B:
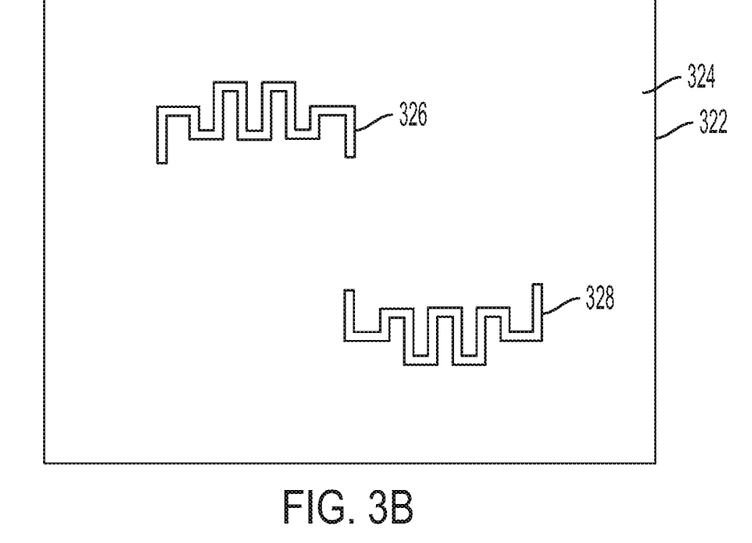
FIG. 3B is a schematic illustration of an interposer according to an embodiment of the current invention.

FIG. 3B is a schematic illustration of an interposer 322 according to an embodiment of the current invention. The interposer 322 includes a dielectric material 324 comprising two superconducting microwave waveguides 326, 328 formed therein.

Figure 3C:
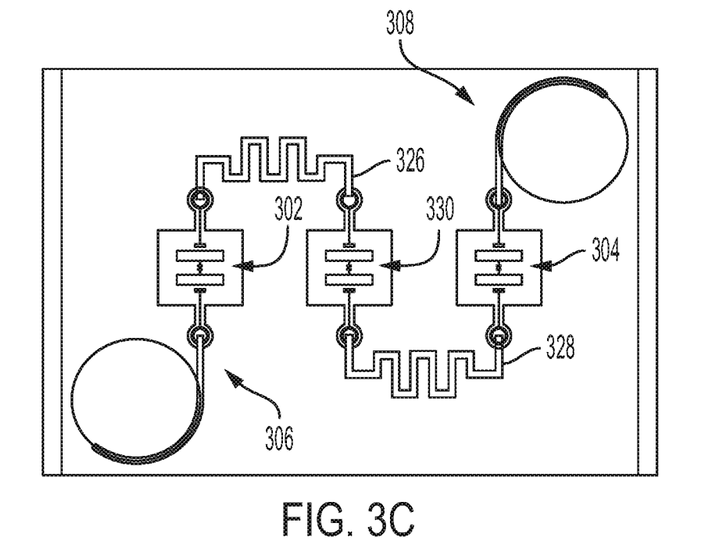
FIG. 3C is a schematic illustration of the interposer of FIG. 3B coupled to the transduction chip of FIG. 3A and to a qubit chip.

FIG. 3C is a schematic illustration of the interposer 322 of FIG. 3B coupled to the transduction chip 300 of FIG. 3A and to a qubit chip, such as the qubit chip 212 shown in FIG. 2B. The superconducting microwave waveguides 326, 328 are configured to transmit quantum information from the data qubit 330 to the microwave-to-optical frequency transducers 306, 308 via the transduction qubits 302, 304. The microwave waveguides 306, 308 transmit quantum information from the data qubit 330 to the transduction qubits 302, 304 via microwave photons. The embodiments of the invention are not limited to the particular number of data qubits, superconducting microwave waveguides, and transduction qubits shown in the example illustrated in FIGS. 3A-3C.

According to an embodiment of the current invention, each of the plurality of data qubits has a relaxation time (T1) and a coherence time (T2) sufficient for performing quantum computation. The data qubits according to an embodiment of the current invention may have T1 and T2 times that are greater than 75 µs. The data qubits according to an embodiment of the current invention may have T1 and T2 times on the order of 100 µs or greater.

According to an embodiment of the current invention, each of the plurality of transduction qubits has a relaxation time and a coherence time that exceeds a transduction time of the microwave-to-optical frequency transducer. For example, if the time required for microwave-to-optical frequency transduction is about 10 ns-1 µs, then the transduction qubit may have T1 and T2 times on the order of about 3 µs or more. According to an embodiment of the current invention, the transduction time of the microwave-to-optical frequency transducer is less than 1 µs. According to an embodiment of the invention, the transduction qubits have T1 and T2 times that are less that the T1 and T2 times of the data qubits.

According to an embodiment of the current invention, the transduction chip includes a substrate that includes one or more of an electro-optic material, a piezoelectric material, or a silicon-on-insulator substrate. According to an embodiment of the invention, the microwave-to-optical frequency transducer comprises an optomechanical system such as, for example, a membrane.

Figure 4:
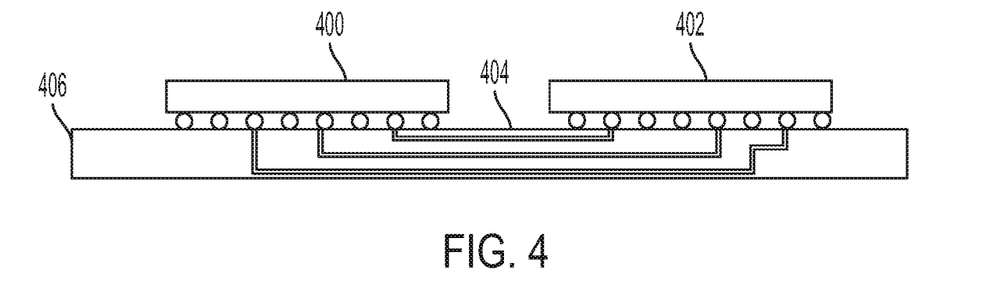
FIG. 4 is a schematic illustration of a qubit chip and a transduction chip coupled to the same surface of an interposer.

As an alternative to the configuration shown in FIG. 1, the qubit chip and the transduction chip may be coupled to the same surface of the interposer. FIG. 4 is a schematic illustration of a qubit chip 400 and a transduction chip 402 coupled to the same surface 404 of an interposer 406.

Figure 5:
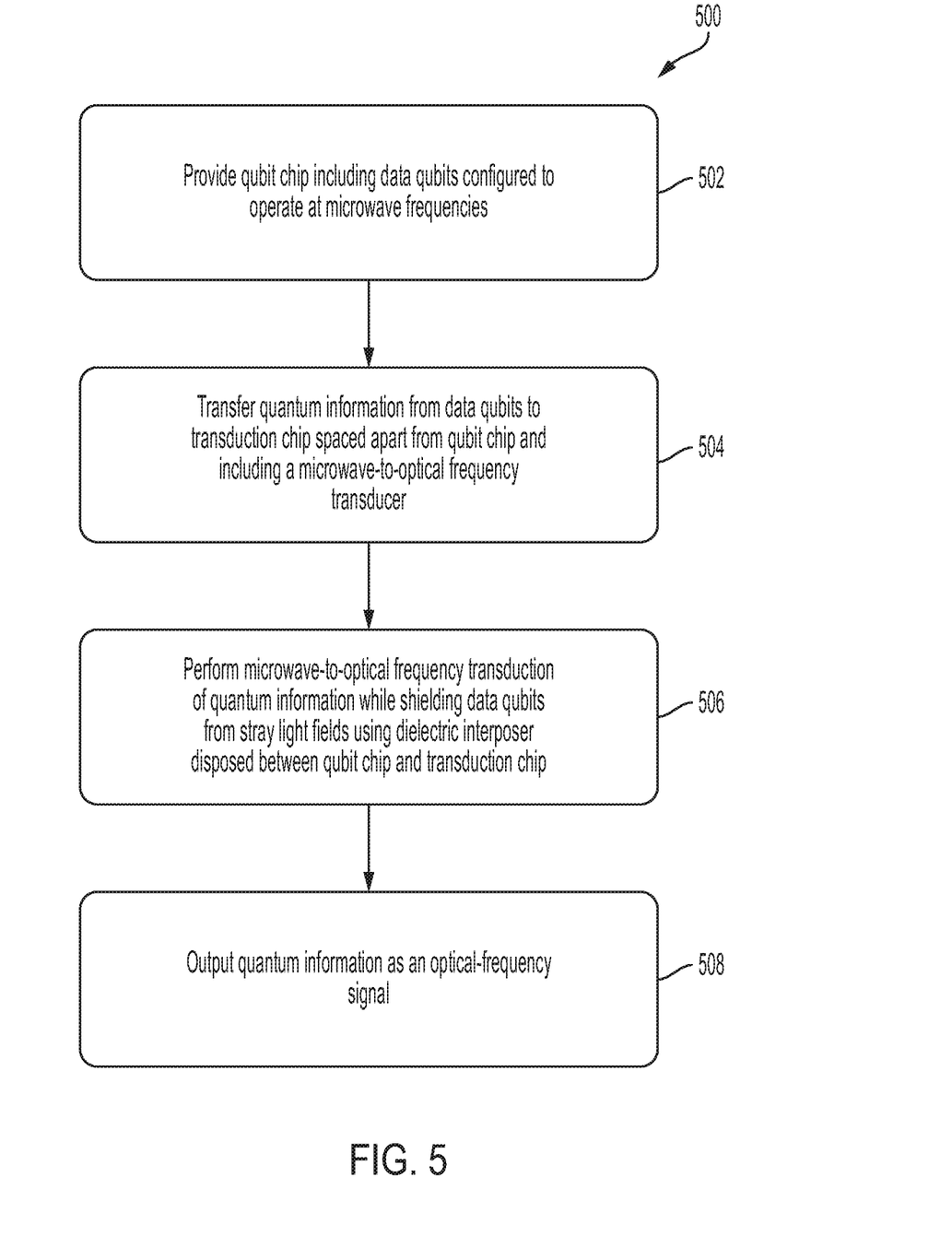
FIG. 5 is a flowchart that illustrates a method for performing optical transduction of quantum information.

FIG. 5 is a flowchart that illustrates a method 500 for performing optical transduction of quantum information. The method 500 includes providing a qubit chip including a plurality of data qubits configured to operate at microwave frequencies 502. The method 500 includes transferring quantum information from the plurality of data qubits to a transduction chip spaced apart from the qubit chip, the transduction chip including a microwave-to-optical frequency transducer 504. The method 500 includes performing microwave-to-optical frequency transduction of the quantum information while shielding the plurality of data qubits from stray light fields using a dielectric interposer disposed between the qubit chip and the transduction chip 506, and outputting the quantum information as an optical-frequency signal 508.

Figure 6:
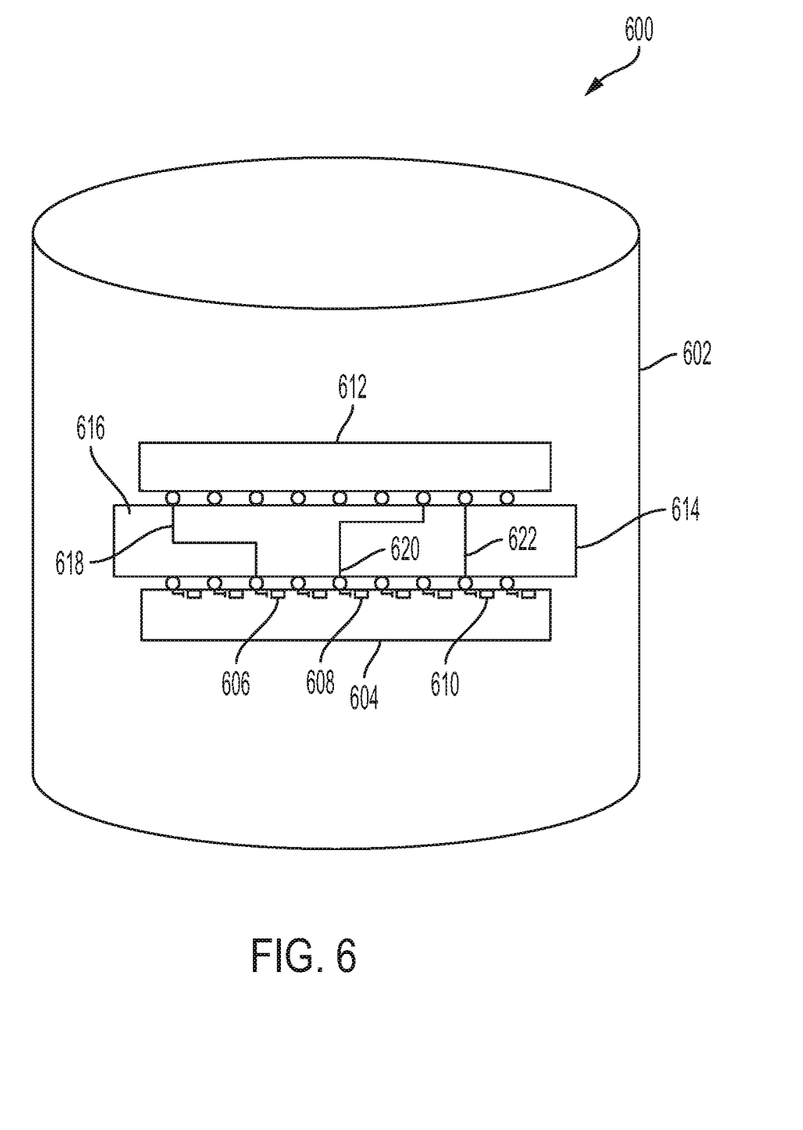
FIG. 6 is a schematic illustration of a quantum computer according to an embodiment of the present invention.

FIG. 6 is a schematic illustration of a quantum computer 600 according to an embodiment of the present invention. The quantum computer 600 includes a refrigeration system under vacuum comprising a containment vessel 602. The quantum computer 600 includes a qubit chip 604 contained within a refrigerated vacuum environment defined by the containment vessel 602. The qubit chip 604 includes a plurality of data qubits 606, 608, 610 configured to operate at microwave frequencies. The quantum computer 600 includes a transduction chip 612 contained within the refrigerated vacuum environment defined by the containment vessel 602. The transduction chip 612 is spaced apart from the qubit chip 604 and includes a microwave-to-optical frequency transducer. The quantum computer 600 includes an interposer 614 contained within the refrigerated vacuum environment defined by the containment vessel 602. The interposer 614 is coupled to the qubit chip 604 and the transduction chip 612. The interposer 614 includes a dielectric material 616 including a plurality of superconducting microwave waveguides 618, 620, 622 formed therein. The plurality of superconducting microwave waveguides 618, 620, 622 is configured to transmit quantum information from the plurality of data qubits 606, 608, 610 to the microwave-to-optical frequency transducer on the transduction chip 612, and the microwave-to-optical frequency transducer is configured to transduce the quantum information from the microwave frequencies to optical frequencies.

According to an embodiment of the present invention, the dielectric material 616 includes one or more of a printed circuit board, an organic laminate, a silicon chip, a ceramic, a glass-reinforced epoxy laminate material such as FR-4, duroid, or polyether ether ketone (PEEK). According to an embodiment of the present invention, the microwave-to-optical frequency transducer includes a microwave waveguide coupled to a device configured to operate in an optical frequency domain. The transduction chip 612 may further include an optical pump line coupled to the device configured to operate in an optical frequency domain, such as the optical pump line 208 in FIG. 2. The optical pump line may be configured to transmit the quantum information as an optical-frequency signal from the refrigerated vacuum environment defined by the containment vessel 602 to an exterior of the containment vessel 602. Alternatively or additionally, the optical pump line may be configured to transmit the quantum information as an optical-frequency signal from the transduction chip 612 to a second transduction chip coupled to a second qubit chip.

The quantum computer according to an embodiment of the current invention may include a plurality of data qubit chips, transduction chips, and interposers. Further, the embodiments of the invention are not limited to the particular number of data qubits, microwave-to-optical frequency transducers, and superconducting microwave waveguides shown in FIG. 6.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

We claim:

1. A system for optical transduction of quantum information, comprising:
   a qubit chip comprising a plurality of data qubits configured to operate at microwave frequencies;
   a transduction chip spaced apart from said qubit chip, said transduction chip comprising a microwave-to-optical frequency transducer; and
   an interposer coupled to said qubit chip and said transduction chip, said interposer comprising a dielectric material comprising a plurality of superconducting microwave waveguides formed therein,
   wherein said plurality of superconducting microwave waveguides is configured to transmit quantum information from said plurality of data qubits to said microwave-to-optical frequency transducer on said transduction chip,
   wherein said microwave-to-optical frequency transducer is configured to transduce said quantum information from said microwave frequencies to optical frequencies,
   wherein said transduction chip further comprises an optical pump line coupled to said microwave-to-optical frequency transducer, and
   wherein said optical pump line is configured to transmit said quantum information as an optical-frequency signal from said transduction chip to a second transduction chip coupled to a second qubit chip.

2. The system for optical transduction of quantum information according to claim 1,
   wherein said microwave-to-optical frequency transducer is further configured to transduce quantum information from said optical frequency to said microwave frequencies, and
   wherein said plurality of superconducting microwave waveguides is configured to transmit said quantum information from said microwave-to-optical frequency transducer on said transduction chip to said plurality of data qubits.

3. The system for optical transduction of quantum information according to claim 1, wherein said microwave-to-optical frequency transducer comprises a microwave waveguide coupled to a device configured to operate in an optical frequency domain.

4. The system for optical transduction of quantum information according to claim 3, wherein said device configured to operate in said optical frequency domain comprises an optical resonator.

5. The system for optical transduction of quantum information according to claim 4, where said transduction chip further comprises an optical pump line coupled to said optical resonator,
   wherein said optical pump line is configured to transmit said quantum information as an optical-frequency signal.

6. The system for optical transduction of quantum information according to claim 3, wherein said device configured to operate in said optical frequency domain comprises a bulk acoustic wave resonator.

7. The system for optical transduction of quantum information according to claim 3, wherein said device configured to operate in said optical frequency domain comprises a mechanical coupler.

8. The system for optical transduction of quantum information according to claim 3, wherein said device configured to operate in said optical frequency domain comprises a membrane.

9. The system for optical transduction of quantum information according to claim 1, wherein said transduction chip comprises a plurality of transduction qubits, at least one of the plurality of transduction qubit being coupled to the microwave-to-optical frequency transducer,
   wherein said superconducting plurality of microwave waveguides is configured to transmit quantum information from said plurality of data qubits to said plurality of transduction qubits via microwave photons.

10. The system for optical transduction of quantum information according to claim 9, wherein said transduction chip further comprises a plurality of microwave-to-optical frequency transducers, and wherein each of said plurality of transduction qubits is coupled to one of said plurality of microwave-to-optical frequency transducers.

11. The system for optical transduction of quantum information according to claim 1, wherein said transduction chip comprises a substrate comprising an electro-optic material.

12. The system for optical transduction of quantum information according to claim 1, wherein said transduction chip comprises a substrate comprising a piezoelectric material.

13. The system for optical transduction of quantum information according to claim 1, wherein said transduction chip comprises a silicon-on-insulator substrate.

14. The system for optical transduction of quantum information according to claim 1, wherein said microwave-to-optical frequency transducer comprises an optomechanical system.

15. The system for optical transduction of quantum information according to claim 1, wherein said interposer comprises a first surface and a second surface opposite said first surface,
   wherein said qubit chip is coupled to said first surface, and
   wherein said transduction chip is coupled to said second surface.

16. The system for optical transduction of quantum information according to claim 1, wherein said qubit chip and said transduction chip are coupled to a same surface of said interposer.

17. A system for optical transduction of quantum information, comprising:
   a qubit chip comprising a plurality of data qubits configured to operate at microwave frequencies;
   a transduction chip spaced apart from said qubit chip, said transduction chip comprising a microwave-to-optical frequency transducer; and
   an interposer coupled to said qubit chip and said transduction chip, said interposer comprising a dielectric material comprising a plurality of superconducting microwave waveguides formed therein,
   wherein said plurality of superconducting microwave waveguides is configured to transmit quantum information from said plurality of data qubits to said microwave-to-optical frequency transducer on said transduction chip, wherein said microwave-to-optical frequency transducer is configured to transduce said quantum information from said microwave frequencies to optical frequencies, wherein said transduction chip comprises a plurality of transduction qubits, at least one of the plurality of transduction qubit being coupled to the microwave-to-optical frequency transducer, wherein said superconducting plurality of microwave waveguides is configured to transmit quantum information from said plurality of data qubits to said plurality of transduction qubits via microwave photons, wherein said transduction chip further comprises a plurality of microwave-to-optical frequency transducers, and wherein each of said plurality of transduction qubits is coupled to one of said plurality of microwave-to-optical frequency transducers, wherein each of said plurality of data qubits has a relaxation time and a coherence time sufficient for performing quantum computation, and wherein each of said plurality of transduction qubits has a relaxation time and a coherence time that exceeds a transduction time of said microwave-to-optical frequency transducer.

18. The system for optical transduction of quantum information according to claim 17, wherein each of said plurality of data qubits has a relaxation time and a coherence time greater than 75 μs.

19. The system for optical transduction of quantum information according to claim 17, wherein said transduction time of said microwave-to-optical frequency transducer is less than 1 μs.

20. A method for performing optical transduction of quantum information, comprising:
providing a qubit chip comprising a plurality of data qubits configured to operate at microwave frequencies;
transferring quantum information from said plurality of data qubits to a transduction chip spaced apart from said qubit chip, said transduction chip comprising a microwave-to-optical frequency transducer;
performing microwave-to-optical frequency transduction of said quantum information while shielding said plurality of data qubits from stray light fields using a dielectric interposer disposed between said qubit chip and said transduction chip; and
outputting said quantum information as an optical-frequency signal,
wherein said transduction chip further comprises an optical pump line coupled to said microwave-to-optical frequency transducer,
wherein said optical pump line is configured to transmit said quantum information as an optical-frequency signal from said transduction chip to a second transduction chip coupled to a second qubit chip.

21. A quantum computer, comprising:
a refrigeration system under vacuum comprising a containment vessel;
a qubit chip contained within a refrigerated vacuum environment defined by said containment vessel, wherein said qubit chip comprises a plurality of data qubits configured to operate at microwave frequencies;
a transduction chip contained within the refrigerated vacuum environment defined by said containment vessel, the transduction chip being spaced apart from said qubit chip and comprising a microwave-to-optical frequency transducer; and
an interposer contained within the refrigerated vacuum environment defined by said containment vessel, said interposer being coupled to said qubit chip and said transduction chip, said interposer comprising a dielectric material comprising a plurality of superconducting microwave waveguides formed therein, wherein said plurality of superconducting microwave waveguides is configured to transmit quantum information from said plurality of data qubits to said microwave-to-optical frequency transducer on said transduction chip, wherein said microwave-to-optical frequency transducer is configured to transduce said quantum information from said microwave frequencies to optical frequencies, wherein said transduction chip comprises a plurality of transduction qubits, at least one of the plurality of transduction qubit being coupled to the microwave-to-optical frequency transducer, wherein said superconducting plurality of microwave waveguides is configured to transmit quantum information from said plurality of data qubits to said plurality of transduction qubits via microwave photons, wherein said transduction chip further comprises a plurality of microwave-to-optical frequency transducers, and wherein each of said plurality of transduction qubits is coupled to one of said plurality of microwave-to-optical frequency transducers, wherein each of said plurality of data qubits has a relaxation time and a coherence time sufficient for performing quantum computation, and wherein each of said plurality of transduction qubits has a relaxation time and a coherence time that exceeds a transduction time of said microwave-to-optical frequency transducer.

22. The quantum computer according to claim 21, wherein said dielectric material comprises one or more of a Si wafer, PCB, PEEK, and Teflon.

23. The quantum computer according to claim 21, wherein said microwave-to-optical frequency transducer comprises a microwave waveguide coupled to a device configured to operate in an optical frequency domain.

24. The quantum computer according to claim 21, where said transduction chip further comprises an optical pump line coupled to said microwave-to-optical frequency transducer,
wherein said optical pump line is configured to transmit said quantum information as an optical-frequency signal from said refrigerated vacuum environment defined by said containment vessel to an exterior of said containment vessel.

25. A quantum computer, comprising:
a refrigeration system under vacuum comprising a containment vessel;
a qubit chip contained within a refrigerated vacuum environment defined by said containment vessel, wherein said qubit chip comprises a plurality of data qubits configured to operate at microwave frequencies;
a transduction chip contained within the refrigerated vacuum environment defined by said containment vessel, the transduction chip being spaced apart from said qubit chip and comprising a microwave-to-optical frequency transducer; and
an interposer contained within the refrigerated vacuum environment defined by said containment vessel, said interposer being coupled to said qubit chip and said transduction chip, said interposer comprising a dielectric material comprising a plurality of superconducting microwave waveguides formed therein, wherein said plurality of superconducting microwave waveguides is configured to transmit quantum information from said plurality of data qubits to said microwave-to-optical frequency transducer on said transduction chip, and wherein said microwave-to-optical frequency transducer is configured to transduce said quantum information from said microwave frequencies to optical frequencies, wherein said transduction chip further comprises an optical pump line coupled to said microwave-to-optical frequency transducer, wherein said optical pump line is configured to transmit said quantum information as an optical-frequency signal from said transduction chip to a second transduction chip coupled to a second qubit chip.

* * * * *